US009426926B2

(12) United States Patent
Iwasaki et al.

(10) Patent No.: US 9,426,926 B2
(45) Date of Patent: Aug. 23, 2016

(54) SECURE FLAT WALL MOUNTING RACK

(71) Applicants: Sean Iwasaki, Batavia, IL (US); Jim Jay, Batavia, IL (US); Steve Johnson, Bolingbrook, IL (US); Paul DeCraene, West Chicago, IL (US)

(72) Inventors: Sean Iwasaki, Batavia, IL (US); Jim Jay, Batavia, IL (US); Steve Johnson, Bolingbrook, IL (US); Paul DeCraene, West Chicago, IL (US)

(73) Assignee: ENGINUITY COMMUNICATIONS CORPORATION, Batavia, IL (US)

( * ) Notice: Subject to any disclaimer, the term of this patent is extended or adjusted under 35 U.S.C. 154(b) by 212 days.

(21) Appl. No.: 14/283,516

(22) Filed: May 21, 2014

(65) Prior Publication Data

US 2015/0342083 A1 Nov. 26, 2015

(51) Int. Cl.
*H05K 7/14* (2006.01)
*H05K 5/02* (2006.01)
*H05K 7/18* (2006.01)
*H04Q 1/02* (2006.01)

(52) U.S. Cl.
CPC ............... *H05K 7/186* (2013.01); *H04Q 1/02* (2013.01)

(58) Field of Classification Search
CPC ...... H05K 7/186; H05K 7/14; H05K 7/1411; H05K 7/1488; H05K 5/0217; H05K 5/0221; H05K 5/0208

USPC ............ 361/679.01, 679.02, 679.31–679.33, 361/679.37, 379.39, 724–727, 732, 807, 361/809–810, 825, 829, 832, 601, 622, 628, 361/679.57, 679.4; 174/50, 520; 312/223.1, 312/223.2, 223.3, 294, 317.2, 317.3, 330.1, 312/332.1, 333; 385/135; 439/540.1
See application file for complete search history.

(56) References Cited

U.S. PATENT DOCUMENTS

| 6,362,422 B1 * | 3/2002 | Vavrik | G02B 6/4452 174/496 |
| 7,570,860 B2 * | 8/2009 | Smrha | G02B 6/4452 385/134 |
| 2008/0025683 A1 * | 1/2008 | Murano | G02B 6/4453 385/135 |

* cited by examiner

*Primary Examiner* — Dimary Lopez Cruz
(74) *Attorney, Agent, or Firm* — Justin Lampel

(57) ABSTRACT

A secure flat wall mounting rack for network service provider equipment and cabling is provided. The mounting rack not only restricts unauthorized access to network communication equipment, but is also properly labeled for authorized user. The rack is especially suitable for service demarcation applications involving patch panels. The flat wall mounting rack has a securing bar with a movable plate which, when extended, only allows authorized users to remove and/or access cabling connected to the service ports of an Ethernet service delivery switch. The securing bar also allows for securing service handoff modules to be secured to the same.

10 Claims, 8 Drawing Sheets

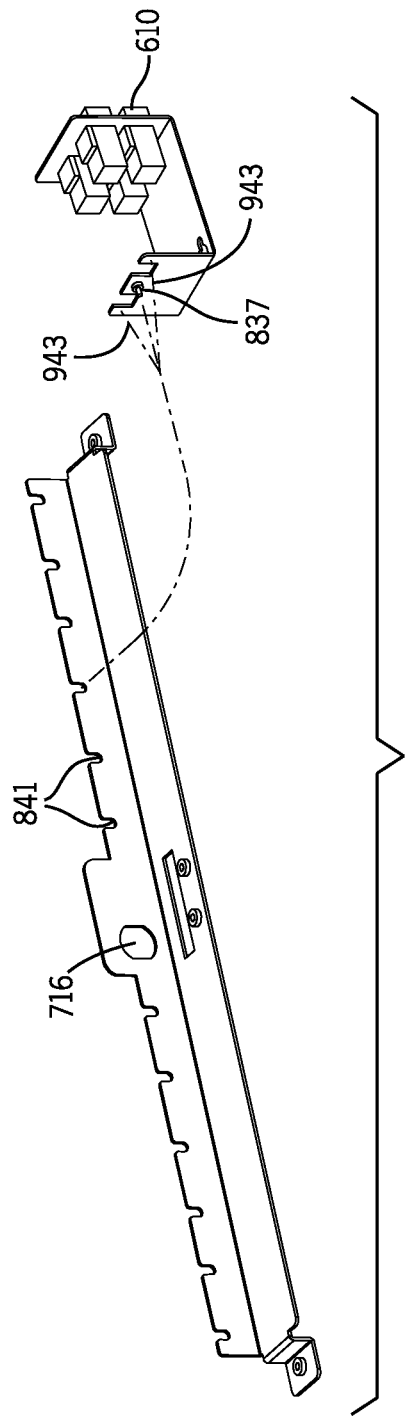
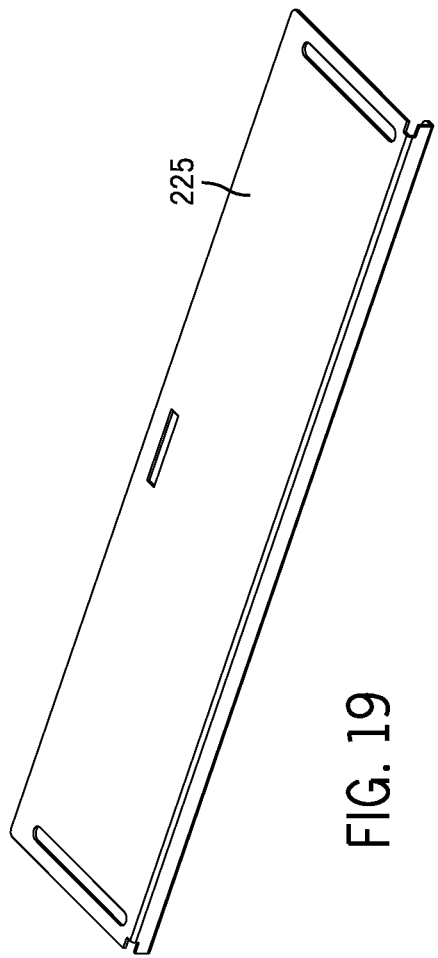
FIG. 18
FIG. 19

SECURE FLAT WALL MOUNTING RACK

BACKGROUND OF THE INVENTION

A secure flat wall mounting rack for network service provider equipment and cabling is provided. The mounting rack not only restricts unauthorized access to network communication equipment, but is also properly labeled for authorized user. The rack is especially suitable for service demarcation applications involving patch panels. The flat wall mounting rack has a securing bar with a movable plate which, when extended, only allows authorized users to remove and/or access cabling connected to the service ports of an Ethernet service delivery switch. The securing bar also allows for securing service handoff modules to be secured to the same.

Attempts have been made at producing effective patch panel assemblies. For example, U.S. Pat. No. 7,404,736 to Herbst discloses a patch panel and strain relief bar assembly having a patch panel, two bracket assemblies connected to the patch panel and a strain relief bar connected to the bracket assemblies. Each bracket assembly includes a first bracket and a second bracket removably secured to the first bracket. The first bracket is connected to the patch panel, and the first bracket has a tab including a cantilever that secures the first bracket to the second bracket. The first bracket also includes two rollover edges connected to the tab. The second bracket is connected to the strain relief bar, and the second bracket has a tab including an aperture that receives a portion of the first bracket therein.

U.S. Pat. No. 7,806,721 to Herndon discloses module assembly having an interface module having a housing having a plurality of jack cavities and associated jack latch openings. The housing is configured to be mated with a patch panel. The module assembly also includes a plurality of modular jacks that are directly inserted into corresponding jack cavities. Each modular jack includes a single latch arm that engages the jack latch opening to retain the modular jack in the jack cavity. Optionally, each modular jack may include a top surface and a bottom surface, wherein the latch arm extends from the top surface and wherein the bottom surface is planar. The bottom surface may rest flush with a bottom wall of the jack cavity.

Further, U.S. Pat. No. 7,207,835 to Levesque discloses an angled patch panel which is configured to be mounted to a rack or console. The angled patch panel facilitates cable management functions and enhances space utilization at and around the rack/patch panel assembly. The angled patch panel includes first and second patch panel elements that are angularly oriented with respect to each other. The transition from the first patch panel element to the second patch panel element is generally achieved in an apex region. The angled patch panel also includes flange members that extend from the first and second patch panel elements. Each of the flange members define a mounting face and an extension arm that is intermediate the mounting face and the patch panel element. The extension arm is dimensioned to facilitate at least partial recessing of the angled patch panel relative to the rack/console when the angled patch panel is mounted thereto.

However, these patents fail to describe a flat wall mounting rack which is easy to use and secure. Further, these patents fail to describe a flat wall mounting rack which is easy to install and eliminates extensive troubleshooting.

SUMMARY OF THE INVENTION

A secure flat wall mounting rack for network service provider equipment and cabling is provided. The mounting rack not only restricts unauthorized access to network communication equipment, but is also properly labeled for authorized user. The rack is especially suitable for service demarcation applications involving patch panels. The flat wall mounting rack has a securing bar with a movable plate which, when extended, only allows authorized users to remove and/or access cabling connected to the service ports of an Ethernet service delivery switch. The securing bar also allows for securing service handoff modules to be secured to the same.

An advantage of the present flat wall mounting rack is that the present flat wall mounting rack allows secured restrictive access to a network service provider's Ethernet service delivery switch service ports, cabling and other electrical components stored within the flat wall mounting rack.

Yet another advantage of the present flat wall mounting rack is that the present flat wall mounting rack efficiently allows communication equipment, a service patch panel, cable management accessories and cable wiring to be compactly and securely stored in the flat wall mounting rack.

And another advantage of the present flat wall mounting rack is that the device may be installed at a customer facility to establish and secure the installation location and to permit the pre-installation of fiber and power cabling without the need for an Ethernet service delivery switch.

Still another advantage of the present flat wall mounting rack is that the present flat wall mounting rack reduces erroneous time-consuming troubleshooting and repairs which typically result from current racks as a result of the lack of or poor location of customer communication service port labeling.

And another advantage of the present flat wall mounting rack is that the present flat wall mounting rack utilizes uniformity in flat wall mounting racks therein increasing efficiency.

Still another advantage of the present flat wall mounting rack is that the present flat wall mounting rack may have a securing bar which secures not only an Ethernet service delivery switch but also service handoff modules.

Yet another advantage of the present flat wall mounting rack is that the present flat wall mounting rack manages fiber cabling.

And another advantage of the present flat wall mounting rack is that the present flat wall mounting rack protects electrical equipment and connections.

Still another advantage of the present flat wall mounting rack is that the present flat wall mounting rack reduces the need for wall space to secure electronic components.

For a more complete understanding of the above listed features and advantages of the present flat wall mounting rack, reference should be made to the detailed description and the drawings. Further, additional features and advantages of the invention are described in, and will be apparent from, the detailed description of the preferred embodiments.

BRIEF DESCRIPTION OF THE DRAWINGS

FIG. 18 illustrates a perspective view of the securing bar.

FIG. 19 illustrates a perspective view of the movable plate.

DETAILED DESCRIPTION OF THE PREFERRED EMBODIMENTS

A secure flat wall mounting rack for network service provider equipment and cabling is provided. The mounting rack not only restricts unauthorized access to network communication equipment, but is also properly labeled for authorized user. The rack is especially suitable for service demarcation applications involving patch panels. The flat wall mounting rack has a securing bar with a movable plate which, when extended, only allows authorized users to remove and/or access cabling connected to the service ports of an Ethernet service delivery switch. The securing bar also allows for securing service handoff modules to be secured to the same.

Figure 1:
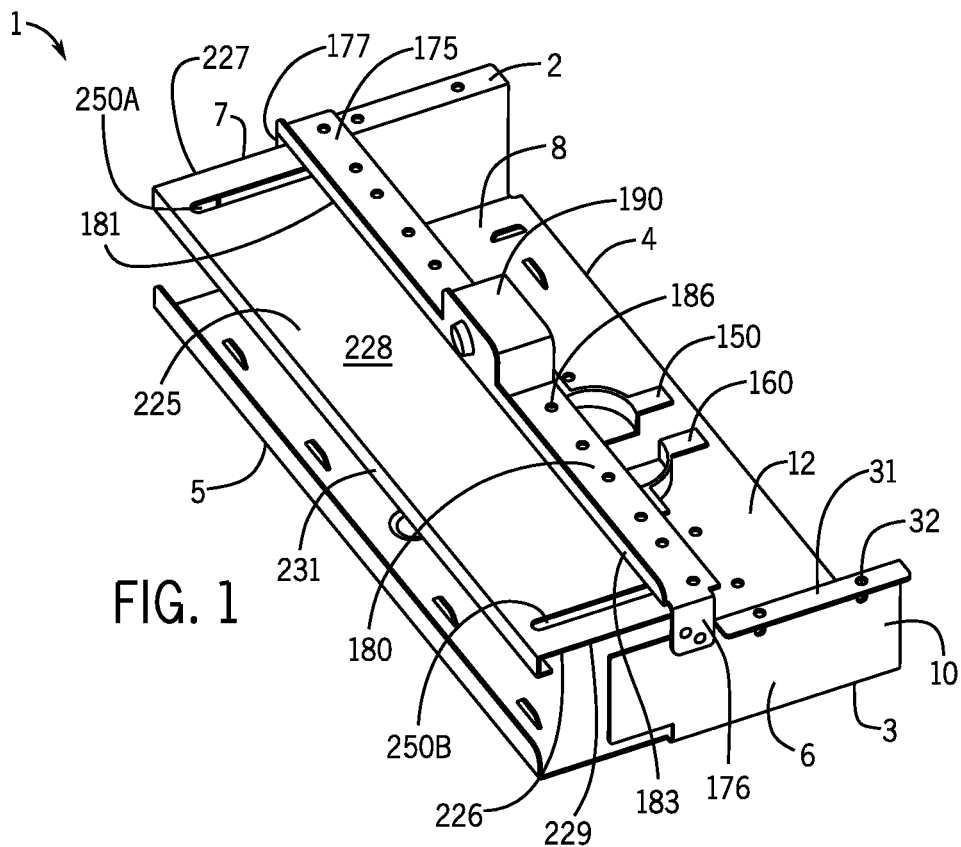
FIG. 1 illustrates a top perspective view of the mount assembly.
Figure 2:
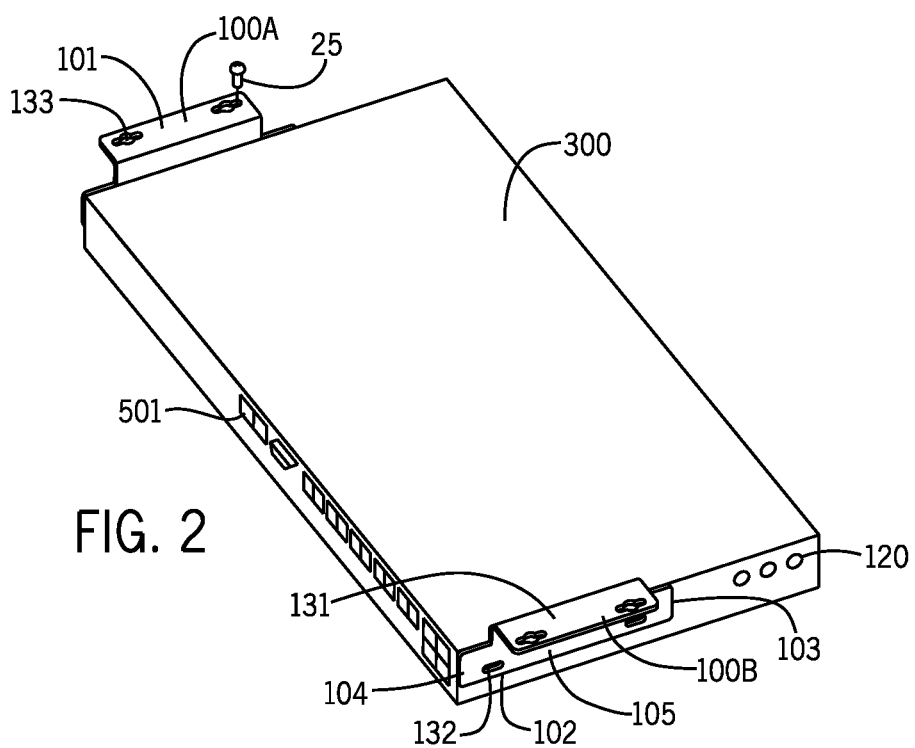
FIG. 2 illustrates a top perspective view of the Ethernet service delivery switch wherein the Ethernet service delivery switch has a first bracket assembly and a second bracket assembly secured to the same.
Figure 12:
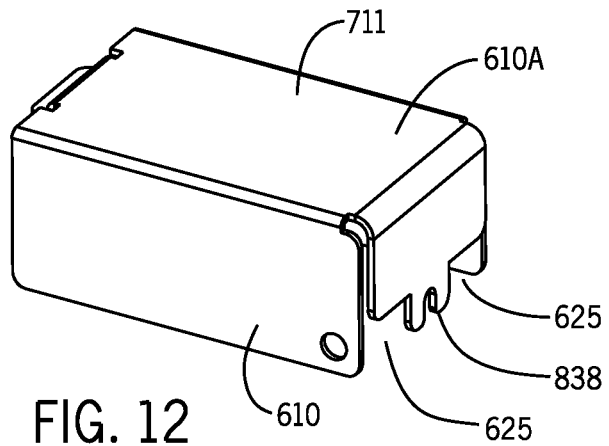
FIG. 12 illustrates a perspective view of the top of a service handoff module guard embodiment.
Figure 14:
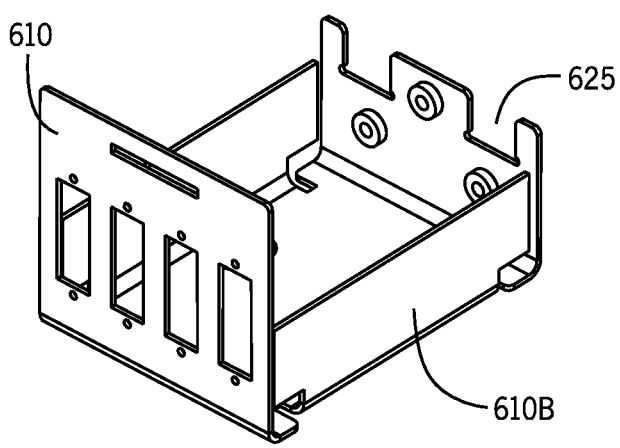
FIG. 14 illustrates a perspective view of the bottom of a service handoff module guard embodiment.

Referring now to FIGS. 1 and 2, a flat wall mounting rack 1 is provided. The flat wall mounting rack 1 may have various elements including a mount assembly 10, a first bracket assembly 100A, a second bracket assembly 100B, a securing bar 175, and a service handoff module guard 610 (FIGS. 12 and 14 illustrate the service handoff module guard divided into two units).

Figure 6:
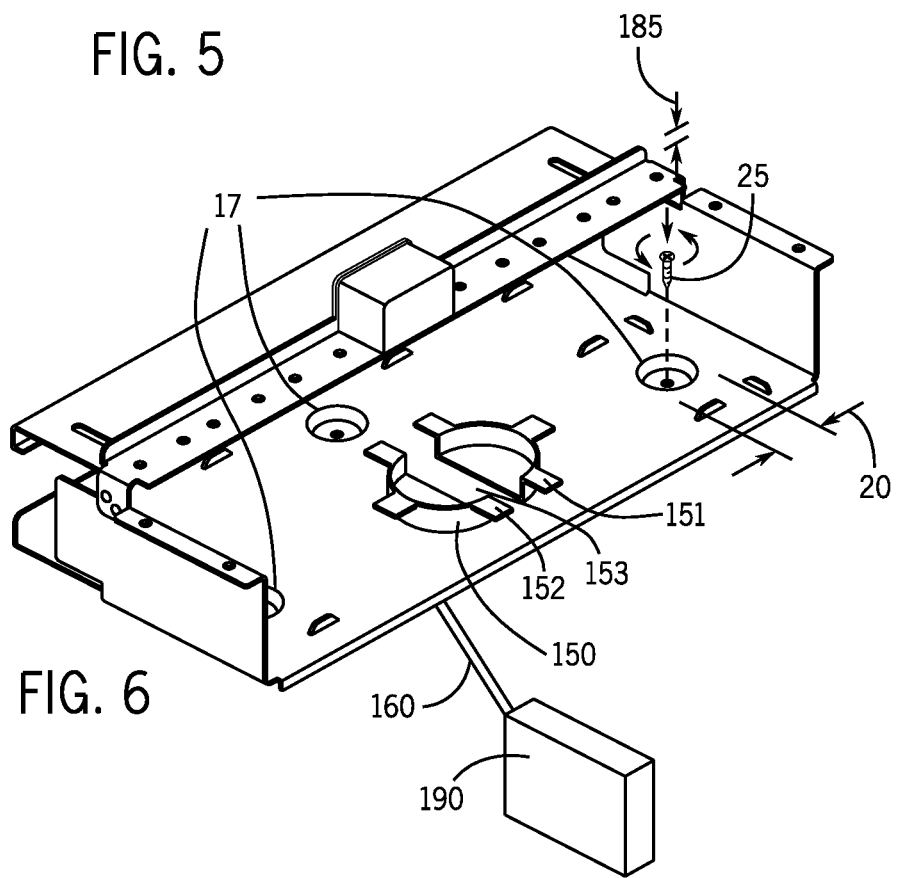
FIG. 6 illustrates a perspective view of the mount assembly.
Figure 7:
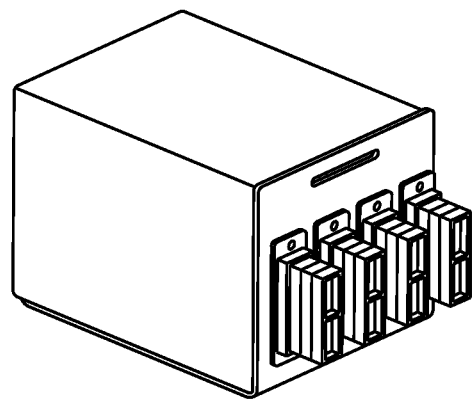
FIG. 7 illustrates a perspective view of a service handoff module embodiment.
Figure 8:
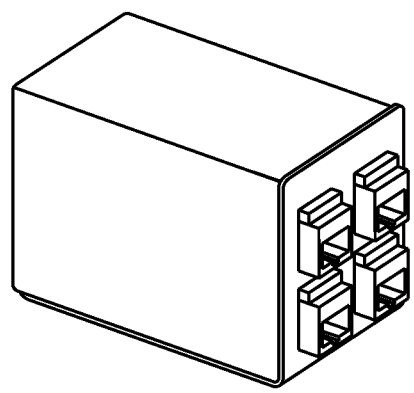
FIG. 8 illustrates a perspective view of a service handoff module embodiment.

The mount assembly 10 may have a top 2, a bottom 3, a front 4, a back 5, a first side 6, a second side 7, and a generally hollow interior 8. In an embodiment, the bottom 3 of the mount assembly 10 may have a top surface 12 wherein the top surface 12 of the mount assembly 10 may be generally flat and generally rectangular. A plurality of mounting holes 17 (FIG. 6) may be located on the top surface 12 of the bottom 3 of the mount assembly 10. FIG. 6 illustrates three mounting holes 17; however, any number of mounting holes 17 may be utilized. The mounting holes 17 of the top surface 12 of the bottom 3 of the mount assembly 10 may have a generally recessed circular portion 20 surrounding the opening 17. The generally recessed circular portion 20 may allow a screw 25 to be inserted into the opening 17 such that the top of the screw 25 does not extend above the surface of the bottom 12.

The top surface 12 of the bottom 3 of the mount assembly 10 may have an adjustable take-up reel 150. The adjustable take-up reel 150 may secure, for example, a fiber 160 (FIG. 6) entering into the interior 8 of the mount assembly 10 from an opening on first side 6 or second side 7 of the mount assembly 10. The fiber 160 entering the adjustable take-up reel 150 may be secured to a distribution box/panel 190.

Figure 17:
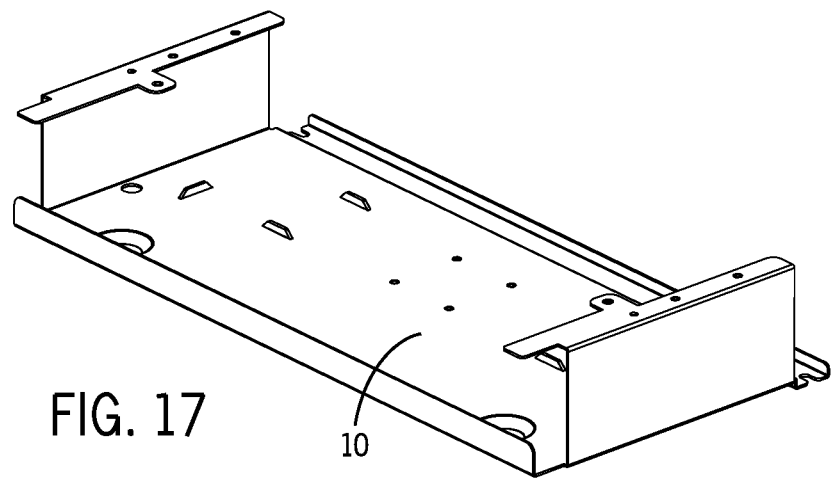
FIG. 17 illustrates a perspective view of the mount assembly wherein the securing bar is removed.

The adjustable take-up reel 150 of the mount assembly 10 may have a first side 151 (FIG. 6) and a second side 152 where each side is removable and secured to the bottom 12 by means of screws. The first side 151 and the second side 152 may somewhat resemble a half-circle wherein a bridge 153 extends between the first side 151 and the second side 152 of the adjustable take-up reel 150. The first side 151 and the second side 152 of the adjustable take-up reel 150 securely groom excess fiber cables and ensuring the cable's proper bend radius while the bridge 153 may be adjusted to support multiple fiber cables of various cable lengths. The bridge 153 may be adjusted by securing the removable side 151 and side 152 to a plurality of screw holes to the bottom 10 as shown in FIG. 17 in a desired location with respect to the distance between the first side 151 and the second side 152.

The first side 6 and the second side 7 of the mount assembly 10 may be generally rectangular and may be substantially perpendicular to the bottom 3 of the mount assembly 10. The first side 6 and the second side 7 may have a perpendicular extending support 31. The perpendicular extending support 31 may be generally perpendicular with respect to the first side 6 and second side 7 and generally parallel with respect to the top 2 and bottom 3 of the mount assembly 10. The generally perpendicular extending support 31 may have openings 32 which may be used to receive a screw or the like.

The top 2 of the mount assembly 10 may have a securing bar 175. The securing bar 175 may have a first end 176 and a second end 177. The first end 176 of the securing bar 175 may be secured to the first side 6 of the mount assembly 10 and the second side 176 of the securing bar 175 may be secured to the second side 7 of the mount assembly 10. The securing bar 175 may have a top surface 180. Ridge 181 may be located on the top 180 surface of the securing bar 175. The ridge 181 may run generally parallel with the securing bar 175 and may extend upward from a back edge 183 of the securing bar 175. The ridge 181 may have a height 185 (FIG. 6). In an embodiment, as illustrated in FIG. 18, the ridge 181 of the securing bar 175 may have a plurality of slits 841 (as described below). The height 185 of the ridge 181 of the securing bar 175 may brace and allow for proper securing the service handoff modules 600 (as described below).

The securing bar 175 may be generally flat and generally rectangular. A plurality of holes 186 may run near the ridge 181 of securing bar 175, extending from the first end 176 of the securing bar 175 to the second end 177 of the securing bar 175. The plurality of holes 186 may allow for a service handoff module guard 610 (FIGS. 12 and 14) as described below to be secured to the securing bar 175. A locking mechanism 190, such as a standard key lock, may be located on the top surface 180 of the securing bar 175. In an embodiment, the locking mechanism 190 may be located approximately half-way between the first end 176 and the second end 177 of the securing bar 175 so as to provide a more secure and more rigid location to lock the device 1.

Figure 13:
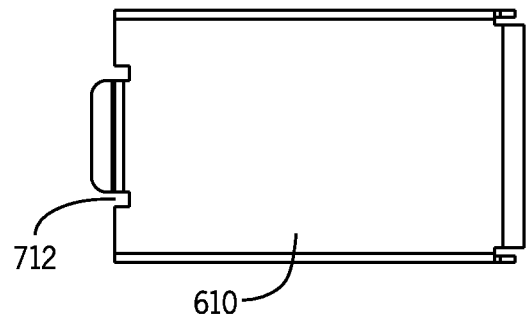
FIG. 13 illustrates a top view of the top of a service handoff module guard embodiment.
Figure 15:
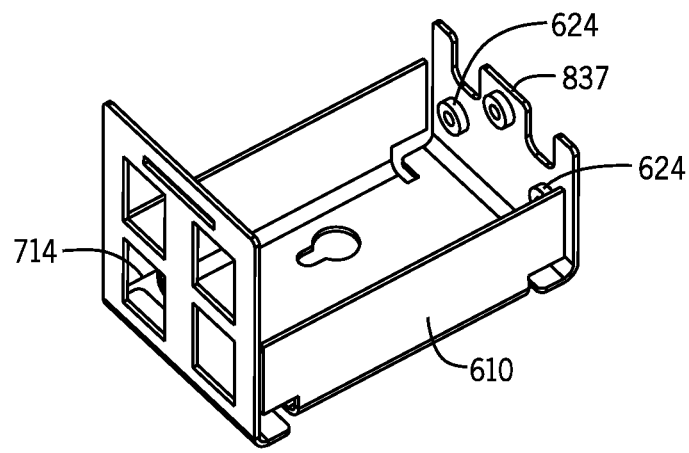
FIG. 15 illustrates a perspective view of the bottom of a service handoff module guard embodiment.
Figure 16:
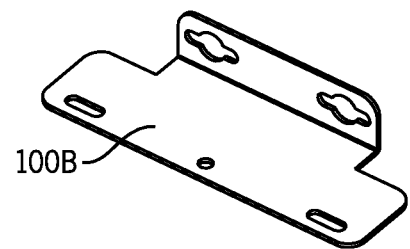
FIG. 16 illustrates a perspective view of the bracket assembly.

In an embodiment, the service handoff module guard 610 may be split into two different pieces (FIGS. 12 and 14). FIGS. 12 and 13 illustrate embodiments of the top of the service handoff module guard 610 and FIGS. 14 and 15 illustrate embodiments of the bottom of the service handoff module guard 610. In use, the bottom of the service handoff module guard 610 is placed directly on the securing bar 175, the service handoff module 600 may be placed in the bottom of the service handoff module guard 610 and the top of the service module handoff guard 610 may then be placed over the service handoff module 600 resulting in the service handoff module 600 being largely enclosed by the service handoff module guard 610. In an embodiment, the service handoff module guard 610 may be secured to the back edge 183 of the securing bar 175 or to the top surface 180 of the securing bar 175 by, for example, a screw (not shown).

Figure 3:
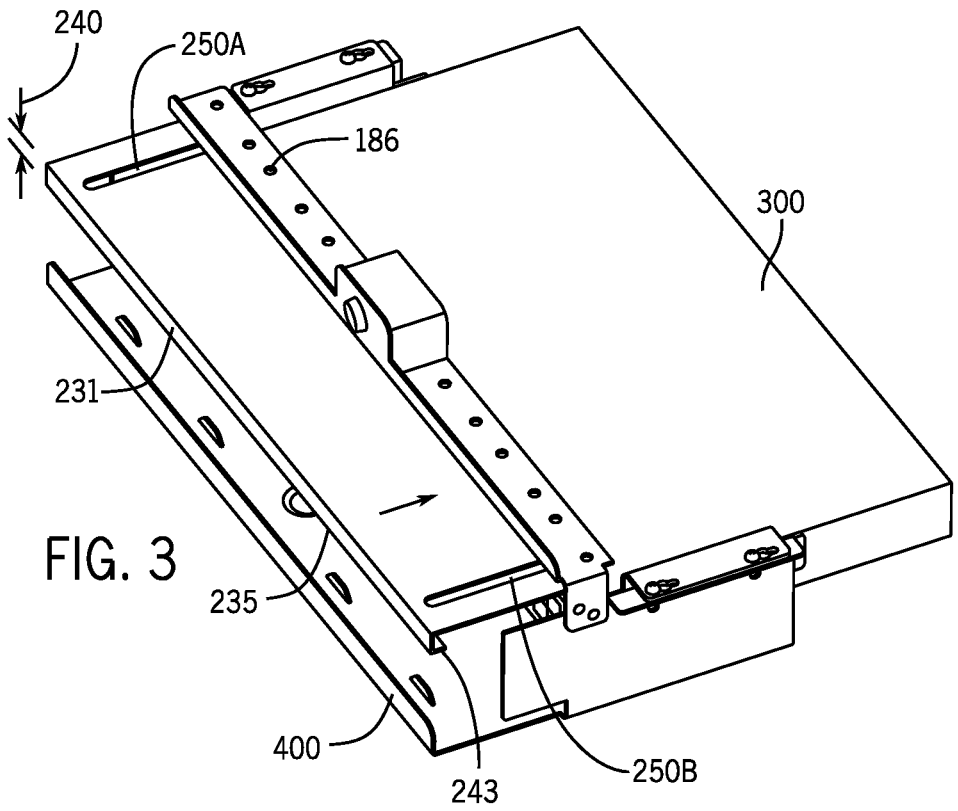
FIG. 3 illustrates the Ethernet service delivery switch being secured into the mount assembly wherein the movable plate is in a First Position A (the inaccessible orientation).

A movable plate 225 (FIG. 1) may be associated with the mount assembly 10. The movable plate 225 may be generally flat having a first side 226 a second side 227, a top surface 228, a bottom surface 229, a front 230 (FIG. 4) and a back 231. The back 231 of the movable plate 225 may have a ridge 235 (FIG. 3) which extends downward, toward the mount assembly 10. The ridge 235 may have a height 240 (FIG. 3). The ridge 235 may extend downward in a perpendicular manner with respect to the movable plate 225. The ridge 235, in turn, may have a second ridge 243 which extends perpendicular from the ridge 235. More specifically, the second ridge 243 may run generally parallel with respect to the top surface 228 of the movable plate 225 so that the second ridge 243, the ridge 235 and the top surface 228 of the movable plate 225 for a u-shaped gripping mechanism.

In an embodiment, the bottom 12 of the mount assembly 10 may have a perpendicular ridge 400 (FIG. 3). The perpendicular ridge 400 may run along the entire length of the back 5 of the bottom 3 of the mount assembly 10. The perpendicular ridge 400 may extend upward, toward to the top 2 of the mount assembly 10. The perpendicular ridge 400 may be generally parallel with respect to the ridge 235 of the movable plate 225. As a result, the back portion of the mount assembly 10 may be partially covered by the ridge 235 of the movable plate 225 and the perpendicular ridge 400 of the bottom 3.

In an embodiment, an opening 525 (FIG. 4) may be located near the perpendicular ridge 400 at the back 5 of the mount assembly 10 on the bottom 3 of the mount assembly 10. The opening 525 may allow a screw 25 or other securing mechanism to secure the mount assembly 10 to a wall or shelf, similar to the openings 17 illustrated in FIG. 6.

The top surface 228 of the movable plate 225 may have, for example, two elongated slits 250A and 250B. The elongated slits 250A and 250B may run parallel to each other, and parallel with respect to the side of the sides of the movable plate 225. The elongated slits 250A and 250B may be located near the side of the movable plate 225 and may run almost from the front 230 of the movable plate 225 to the back 231 of the movable plate 225.

Figure 4:
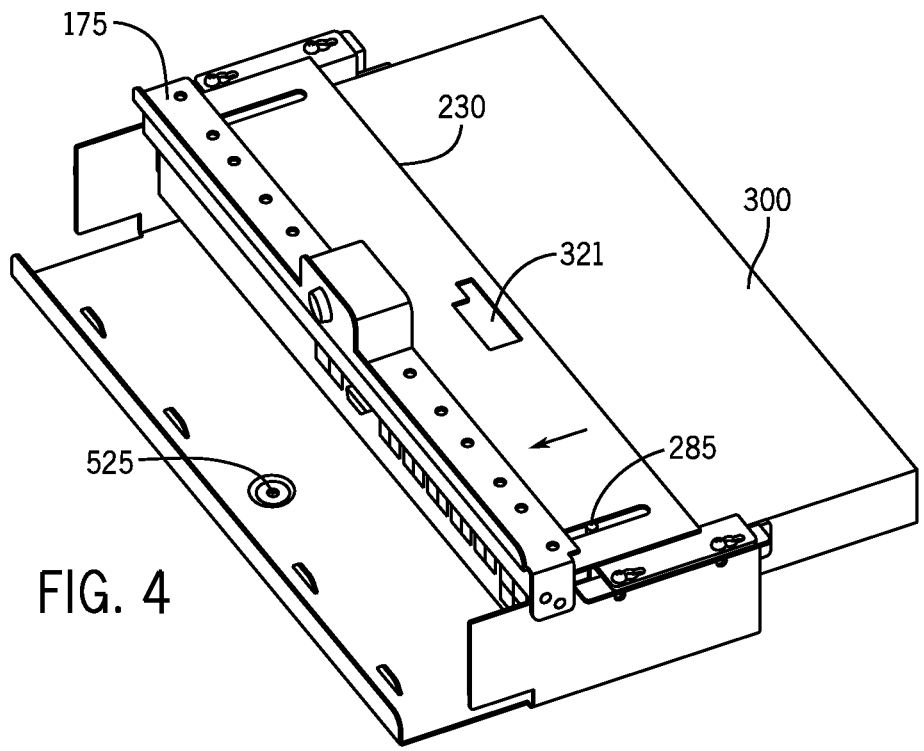
FIG. 4 illustrates the Ethernet service delivery switch being secured into the mount assembly wherein the movable plate is in a Second Position B (the accessible orientation).

In an embodiment, the movable plate 225 moves from a First Position A (FIG. 3) to a Second Position B (FIG. 4). More specifically, the movable plate 225 may move from the First Position A (wherein the movable plate 225 is closest to the back 5 of the device 1) to the Second Position B (closer to the front 4 of the device 1). The movable plate 225 may move with respect to the securing bar 175 which remains stationary. As the movable plate 225 moves from the Second Position B to the First Position A, the movable plate 225 makes it difficult to reach or access the cables in the back of the service delivery switch 300.

As the movable plate 225 moves from the First Position A to the Second Position B, a pin (or screw) 285 (FIG. 4) secured within each of the elongated slits 250A and 250B of the movable plate 225 allows the movable plate 225 to side the distance of the elongated slits 250A and 250B. In an embodiment, the movable plate 225 may be prevented from moving (by the locking mechanism 190) and locked into a desired position such that only an authorized person may shift the moveable plate 225 between the First Position A and the Second Position B. In particular, the movable plate 225 may be locked into a desired position with respect to the securing bar 175 when a pin (not shown) of the locking mechanism 190 is rotated downward and is moved into an opening 321 of the movable plate 225 as described below. To release the movable plate 225, the lock 190 is unlocked and the pin of the lock rotates upward, and out of the opening 321.

In an embodiment, the distance from the first side 6 to the second side 7 of the mount assembly 10 may be slightly greater than the distance from the first bracket assembly 100A to the second bracket assembly 100B such that a service delivery switch 300 may fit snugly through the interior 8 of the mount assembly 10 (as described below).

The first bracket assembly 100A and second bracket assembly 100B may allow the service delivery switch 300 to be inserted within the mount assembly 10 horizontally and quickly or at a time or convenience. For example, it is typical that the installer prepares the site for installation at the customer location by identifying and securing the installation space. At the customer location, the space for equipment and service installation can be used by other service providers. With prior art, the service delivery equipment was needed to install and secure the space during site preparation. If the service delivery switch is backordered from the manufacturer or is unavailable, the installer would have to wait until he or she receives the equipment. The space may not be unavailable and the time and effort to identify an alternative installation space and cabling routing is required. If the communication service to the end-user is an extreme priority, the installer may be forced to compromise proper equipment installation and cabling practices. The present device locks up the required space for the service delivery switch 300. In addition, most if not all service delivery equipment is designed for rack installation. The first bracket assembly 100A and second bracket assembly 100B allows the service deliver equipment to be installed flat or on a wall.

The first bracket assembly 100A and second bracket assembly 100B may each have a top 101, a bottom 102, a front 103, a back 104, a first side 105 and a second side (not shown). In an embodiment, a plurality of vent holes 120 may be located on the service delivery switch 300. The first bracket assembly 100A and second bracket assembly 100B may have a first plane 131 and a second plane 132 wherein the first plane 131 and the second plane 132 are generally perpendicular with respect to each other. In an embodiment, the second plane 132 may be parallel to and may be secured to the service delivery switch 300. In use, the first plane 131 may extend in a generally parallel manner with respect to the top 2 of the mount assembly 10. The first plane 131 may have openings 133 wherein a securing device 25 (such as a screw) may be inserted into.

As stated above, in an embodiment, an Ethernet service delivery switch 300, such as a Ciena 3930 ™ may be secured to the first bracket assembly 100A and second bracket assembly 100B. In particular, the sides of the service delivery switch 300 may be secured to the first bracket assembly 100A and second bracket assembly 100B.

Once the Ethernet service delivery switch 300 is secured within the mount assembly 10 and the movable plate 225 is moved to the First Position A, the locking mechanism 190 is locked and the movable plate cannot be moved with respect to the securing bar 175. In an embodiment, the Ethernet service delivery switch 300 may be removed or installed when the movable plate 225 is in the First Position A or the Second Position B. When the service delivery switch 300 is secured into the mount assembly 10 and when the movable plate 225 is in the First Position A (FIGS. 3 and 11), the connection points of cables 500 (FIG. 11) which are connected to the back of the Ethernet service delivery switch 300 are therein secured and accessible only by authorized personnel. In particular, when the locking mechanism 190 is activated, the movable plate 225 cannot move and the movable plate 225 therein prevents an unauthorized person from accessing the connection point 501 (FIG. 2) of the Ethernet service delivery switch 300.

Figure 5:
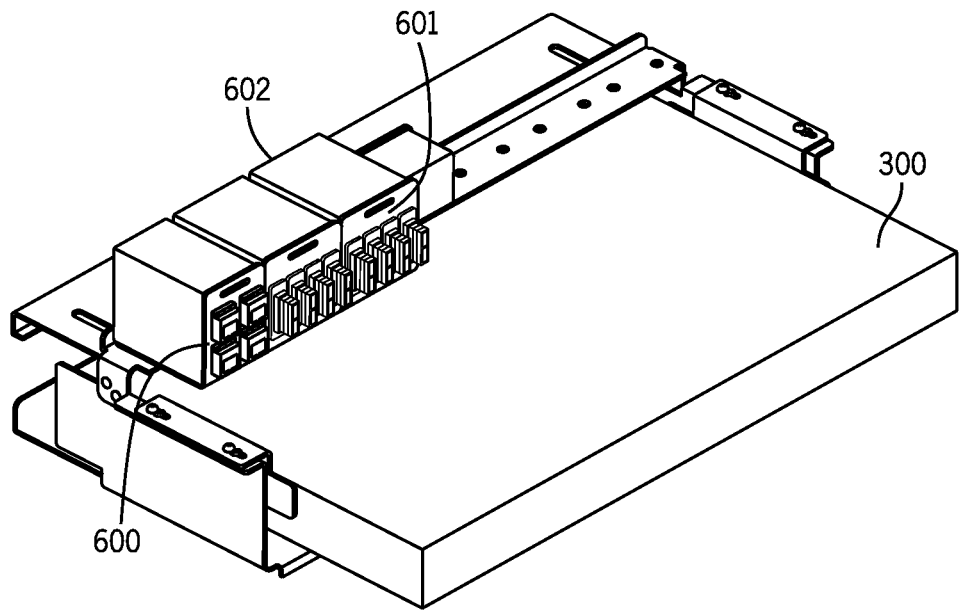
FIG. 5 illustrates a front perspective view of the Ethernet service delivery switch secured within the mount assembly wherein service handoff modules are secured to the securing bar.
Figure 11:
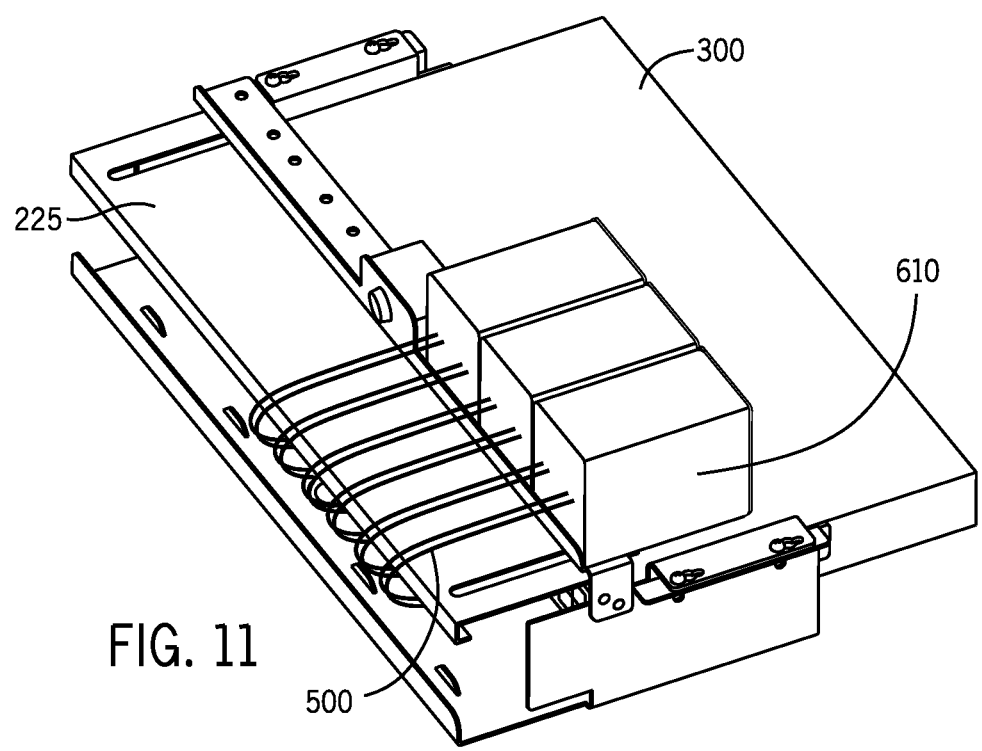
FIG. 11 an alternative view of the mount assembly wherein the Ethernet service delivery switch is secured within the mount assembly.

Referring now to FIG. 5, in an embodiment, the device 1 may allow service handoff modules 600 (also called "demarcation modules") to be secured to the device 1. The service handoff modules 600 may be protected and secured within removable service handoff module guards 610 (FIG. 11). The service handoff module guard 610 may be divided into a top unit 610A (FIG. 12) and a bottom unit 610B (FIG. 14). A customer may selectively secure a plurality of service handoff modules guards 610 containing the service handoff modules 600 to, for example, the securing bar 175. In particular, the service handoff modules guards 610 may be selectively secured to the top surface 180 of the securing bar 175 while the service handoff module guards 610 substantially cover the service handoff modules 600.

Figure 9:
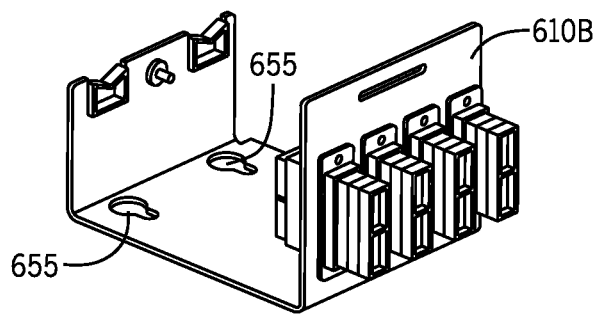
FIG. 9 illustrates a perspective view of a service handoff module guard embodiment.

The plurality of holes 186 on the securing bar 175 may be used to secure the service handoff module guards 610 to the securing bar 175. More specifically, the bottom service handoff module guard 610B may have at least one opening 655 (FIG. 9) which allows a screw (not shown) or the like to secure the bottom service handoff module guard 610B through the openings 186 of the securing bar 175. In an embodiment, the bottom service handoff module guard 610B may have at least two securing units 624 which lock into corresponding openings 625 (FIG. 12) of the top service handoff module guard 610A. In an embodiment, an external pin 943 (FIG. 18) on the bottom service handoff module guard 610B may lock into one of a plurality of slits 841 (FIG. 18) of the ridge 181 of the securing bar 175.

In use, the securing bar 175 may be used to secure the Ethernet service delivery switch 300 and the service handoff modules 600. More specifically, in use, the securing bar 175 may be located between the Ethernet service delivery switch 300 and the service handoff modules 600. The service handoff modules 600 may have a front 601 (FIG. 5) and a back 602. The front 601 of the service handoff modules 600 may face the front 4 of the mount assembly 10. Cables 500 exiting the service handoff module 600 may pass through the service handoff module guard 610 and may be connected to the Ethernet service delivery switch 300.

Referring now to FIG. 4, in an embodiment, the movable plate 225 may have an opening 321. The opening 321 may be generally rectangular in shape having an extended portion. The opening 321 may allow the locking mechanism 190 to lock the movable plate 225 in the First Position A. In an embodiment, an opening 716 (FIG. 18) may be located on the securing bar 175. The opening 716 of the securing bar 175 may allow the locking mechanism 190 to lock onto the securing bar 175.

Figure 10:
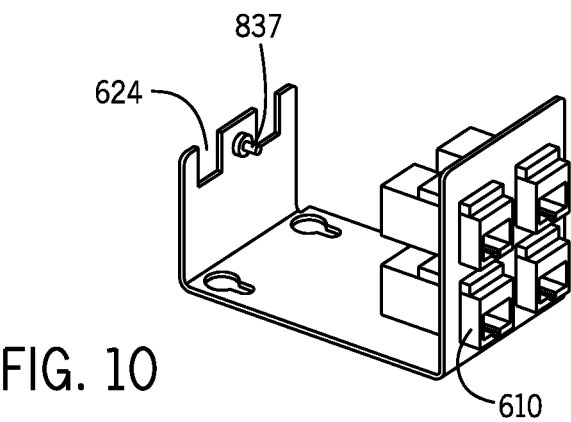
FIG. 10 illustrates a perspective view of a service handoff module guard embodiment.

Referring now to FIG. 10, in an embodiment, a service handoff module guard 610 may have an extended pin 837. The extended pin 837 of the service handoff module guard 610 and may allow the top service handoff module guard 610A to lock into the bottom service handoff module guard 610B. More specifically, the extended pin 837 of the bottom service handoff module guard 610B may lock into an opening 838 (FIG. 12) of the top service handoff module guard 610A and therein the service module guard 610 may prevent movement of the service handoff module 600.

Finally, referring now to FIGS. 12 and 13, in an embodiment, the service handoff module guard 610 may have a top 711 wherein the top 711 has at least one slit 712 extending down a side of the service handoff module guard 610. The slit 712 may allow for the easy bending of metal back cover for manufacturing. In an embodiment, the service handoff module guard 610 may have an opening 714 on the side of the service handoff module guard 610. The opening 714 may allow access to the service handoff module 600.

Although embodiments of the invention are shown and described therein, it should be understood that various changes and modifications to the presently preferred embodiments will be apparent to those skilled in the art. Such changes and modifications may be made without departing from the spirit and scope of the invention and without diminishing its attendant advantages.

We claim:

1. A secure flat wall mounting rack for network service provider equipment comprising:
   a first unit having a top, a bottom, a front, a back, a first side, a second side and a generally hollow interior and wherein the top is generally open;
   a movable second unit having a top, a bottom, a front, a back, a first side and a second side;
   a securing bar wherein the securing bar has a top, a bottom, a first side, a second side, a front and a back and wherein the securing bar is permanently secured to the first unit;
   wherein the movable second unit moves from a first position with respect to the first unit and the securing bar to a second position with respect to the first unit and the securing bar,
   a service delivery switch having a top, a bottom, a front, a back, a first side and a second side;
   a first bracket of the service delivery switch wherein the first bracket secures the first side of the service delivery switch to the first side of the first unit and a second bracket of the service delivery switch wherein the second bracket secures the second side of the service delivery switch to the second side of the first unit;
   wherein the service delivery switch is secured between the first unit and the second unit; and
   wherein the movable second unit prevents access to a connection point of the service delivery switch when the movable second unit is in the first position and wherein the movable second unit allows access to the connection point wherein the movable second unit is in the second position.

2. The secure flat wall mounting rack for network service provider equipment of claim 1 further comprising:
   a selective locking mechanism located on the securing bar wherein the selective locking mechanism prevents the movement of the second unit from the first position to the second position with respect to the first unit.

3. The secure flat wall mounting rack for network service provider equipment of claim 1 further comprising:
   a plurality of openings on the bottom of the first unit wherein the plurality of openings receive a screw or the like for securing the first unit to a stationary surface.

4. The secure flat wall mounting rack for network service provider equipment of claim 1 further comprising:
   a first slit running parallel to the first side of the second unit and a second slit running parallel to the second side of the second unit wherein the first slit and the second slit receive a pin and allow the second unit to slide from the first position to the second position.

5. The secure flat wall mounting rack for network service provider equipment of claim 1 further comprising:
   a plurality of openings running along the top of the securing bar wherein the plurality of openings receive a pin of a service handoff module guard and wherein the service handoff module guard covers a service handoff module.

6. The secure flat wall mounting rack for a network service provide equipment of claim 5 wherein the service handoff module guard has a top portion and a bottom portion wherein the top portion and the bottom portion may be separated from each other to insert the service handoff module between the top portion and the bottom portion.

7. The secure flat wall mounting rack for a network service provide equipment of claim 6 further comprising: on an opening on the bottom portion of the service handoff module guard wherein the opening receives a screw and wherein the screw secures the bottom of the service handoff module guard to the securing bar.

8. The secure flat wall mounting rack for a network service provide equipment of claim 5 further comprising:
   an electrical cable secured between the service handoff module and the service delivery switch.

9. The secure flat wall mounting rack for a network service provide equipment of claim 8 wherein the electrical cable passes over the top of the movable second unit.

10. The secure flat wall mounting rack for network service provider equipment of claim 1 further comprising:
   a ridge located at the back of the movable second unit wherein the ridge extends downward toward the bottom of the first unit in a generally perpendicular orientation with respect to the top of the movable second unit and wherein the ridge prevents access to a connection point of the service delivery switch when the movable second unit is in the first position.

\* \* \* \* \*